United States Patent
Nedachi

(10) Patent No.: US 8,803,583 B2
(45) Date of Patent: Aug. 12, 2014

(54) POLYPHASE CLOCK GENERATOR

(75) Inventor: Takaaki Nedachi, Tokyo (JP)

(73) Assignee: NEC Corporation, Tokyo (JP)

( * ) Notice: Subject to any disclaimer, the term of this patent is extended or adjusted under 35 U.S.C. 154(b) by 86 days.

(21) Appl. No.: 13/592,831

(22) Filed: Aug. 23, 2012

(65) Prior Publication Data

US 2013/0049831 A1    Feb. 28, 2013

(30) Foreign Application Priority Data

Aug. 25, 2011  (JP) ................................ 2011-183290

(51) Int. Cl.
*G06F 1/04* (2006.01)

(52) U.S. Cl.
USPC ........... 327/296; 327/251; 327/258; 327/271; 327/293

(58) Field of Classification Search
CPC ..................... H03B 27/00; H03K 5/15–5/159; G06F 1/08; G06F 1/10
USPC ......... 327/149, 152, 153, 158, 161, 231–235, 327/250–253, 258, 261, 269–271, 276, 277, 327/284, 291, 293–296
See application file for complete search history.

(56) References Cited

U.S. PATENT DOCUMENTS

| | | | | |
|---|---|---|---|---|
| 6,580,300 | B2 * | 6/2003 | Tagami | 327/254 |
| 8,169,247 | B2 * | 5/2012 | Nedachi | 327/231 |
| 2005/0024117 | A1 * | 2/2005 | Kubo et al. | 327/258 |

FOREIGN PATENT DOCUMENTS

JP   2011-097314 A   5/2011

OTHER PUBLICATIONS

William J. Dally et al., "Digital Systems Engineering Application", Cambridge University Press, Apr. 24, 2008, pp. 604-607, 1 edition.

* cited by examiner

*Primary Examiner* — Patrick O'Neill
(74) *Attorney, Agent, or Firm* — Sughrue Mion, PLLC

(57) ABSTRACT

A polyphase clock generator for use in clock data recovery (CDR) includes a phase selector and a four-to-eight phase converter further including a plurality of delay paths, switches, and phase interpolators. The switches switch over the delay paths so as to select a group of delay paths suited to a clock frequency which is determined in advance. A plurality of reference clock signals with a predetermined phase difference (e.g. 90°) therebetween is selectively delayed while passing through the selected group of delay paths. The phase interpolators interpolate the delayed reference clock signals, passing through the selected group of delay paths, into the reference clock signals, thus generating a plurality of clock signals. The phase selector selectively combines the clock signals with a mixing ratio according to clock data recovery, thus generating a plurality of recovery clock signals with a precise phase difference (e.g.) 45° therebetween.

7 Claims, 13 Drawing Sheets

FIG. 8

| Step | Phase Selector SELC[^]<br>7 6 5 4 3 2 1 0 | PI SELP[^]<br>1 1 1 1 1 1<br>5 4 3 2 1 0 9 8 7 6 5 4 3 2 1 0 | Phase [deg] |
|---|---|---|---|
| 0/128 | 0 0 0 0 0 0 1 1 | 0 0 0 0 0 0 0 0 0 0 0 0 0 0 0 0 | 0 |
| 1/128 | 0 0 0 0 0 0 1 1 | 0 0 0 0 0 0 0 0 0 0 0 0 0 0 0 1 | |
| 2/128 | 0 0 0 0 0 0 1 1 | 0 0 0 0 0 0 0 0 0 0 0 0 0 0 1 1 | |
| 3/128 | 0 0 0 0 0 0 1 1 | 0 0 0 0 0 0 0 0 0 0 0 0 0 1 1 1 | |
| 4/128 | 0 0 0 0 0 0 1 1 | 0 0 0 0 0 0 0 0 0 0 0 0 1 1 1 1 | |
| 5/128 | 0 0 0 0 0 0 1 1 | 0 0 0 0 0 0 0 0 0 0 0 1 1 1 1 1 | |
| 6/128 | 0 0 0 0 0 0 1 1 | 0 0 0 0 0 0 0 0 0 0 1 1 1 1 1 1 | |
| 7/128 | 0 0 0 0 0 0 1 1 | 0 0 0 0 0 0 0 0 0 1 1 1 1 1 1 1 | |
| 8/128 | 0 0 0 0 0 0 1 1 | 0 0 0 0 0 0 0 0 1 1 1 1 1 1 1 1 | |
| 9/128 | 0 0 0 0 0 0 1 1 | 0 0 0 0 0 0 0 1 1 1 1 1 1 1 1 1 | |
| 10/128 | 0 0 0 0 0 0 1 1 | 0 0 0 0 0 0 1 1 1 1 1 1 1 1 1 1 | |
| 11/128 | 0 0 0 0 0 0 1 1 | 0 0 0 0 0 1 1 1 1 1 1 1 1 1 1 1 | |
| 12/128 | 0 0 0 0 0 0 1 1 | 0 0 0 0 1 1 1 1 1 1 1 1 1 1 1 1 | |
| 13/128 | 0 0 0 0 0 0 1 1 | 0 0 0 1 1 1 1 1 1 1 1 1 1 1 1 1 | |
| 14/128 | 0 0 0 0 0 0 1 1 | 0 0 1 1 1 1 1 1 1 1 1 1 1 1 1 1 | |
| 15/128 | 0 0 0 0 0 0 1 1 | 0 1 1 1 1 1 1 1 1 1 1 1 1 1 1 1 | |
| 16/128 | 0 0 0 0 0 1 1 0 | 1 1 1 1 1 1 1 1 1 1 1 1 1 1 1 1 | 45 |
| 17/128 | 0 0 0 0 0 1 1 0 | 0 1 1 1 1 1 1 1 1 1 1 1 1 1 1 1 | |
| 18/128 | 0 0 0 0 0 1 1 0 | 0 0 1 1 1 1 1 1 1 1 1 1 1 1 1 1 | |
| 19/128 | 0 0 0 0 0 1 1 0 | 0 0 0 1 1 1 1 1 1 1 1 1 1 1 1 1 | |
| ⋮ | ⋮ | ⋮ | |
| 31/128 | 0 0 0 0 0 1 1 0 | 0 0 0 0 0 0 0 0 0 0 0 0 0 0 0 1 | |
| 32/128 | 0 0 0 0 1 1 0 0 | 0 0 0 0 0 0 0 0 0 0 0 0 0 0 0 0 | 90 |
| 33/128 | 0 0 0 0 1 1 0 0 | 0 0 0 0 0 0 0 0 0 0 0 0 0 0 0 1 | |
| 34/128 | 0 0 0 0 1 1 0 0 | 0 0 0 0 0 0 0 0 0 0 0 0 0 0 1 1 | |
| ⋮ | ⋮ | ⋮ | |
| 47/128 | 0 0 0 0 1 1 0 0 | 0 1 1 1 1 1 1 1 1 1 1 1 1 1 1 1 | |
| 48/128 | 0 0 0 1 1 0 0 0 | 1 1 1 1 1 1 1 1 1 1 1 1 1 1 1 1 | 135 |
| 49/128 | 0 0 0 1 1 0 0 0 | 0 1 1 1 1 1 1 1 1 1 1 1 1 1 1 1 | |
| 50/128 | 0 0 0 1 1 0 0 0 | 0 0 1 1 1 1 1 1 1 1 1 1 1 1 1 1 | |
| ⋮ | ⋮ | ⋮ | |
| 61/128 | 0 0 0 1 1 0 0 0 | 0 0 0 0 0 0 0 0 0 0 0 0 0 1 1 1 | |
| 62/128 | 0 0 0 1 1 0 0 0 | 0 0 0 0 0 0 0 0 0 0 0 0 0 0 1 1 | |
| 63/128 | 0 0 0 1 1 0 0 0 | 0 0 0 0 0 0 0 0 0 0 0 0 0 0 0 1 | |
| ⋮ | ⋮ | ⋮ | |
| 0/128 | 0 0 0 0 0 0 1 1 | 0 0 0 0 0 0 0 0 0 0 0 0 0 0 0 0 | 0 |
| 1/128 | 0 0 0 0 0 0 1 1 | 0 0 0 0 0 0 0 0 0 0 0 0 0 0 0 1 | |

⌐ ¬
└ ┘ : PHASE SWITCH TIMING OF PHASE SELECTOR

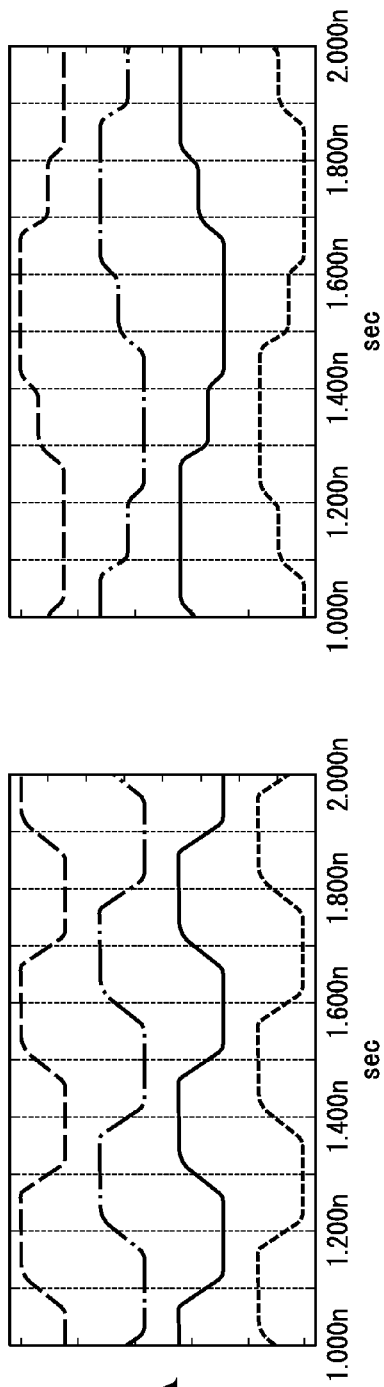
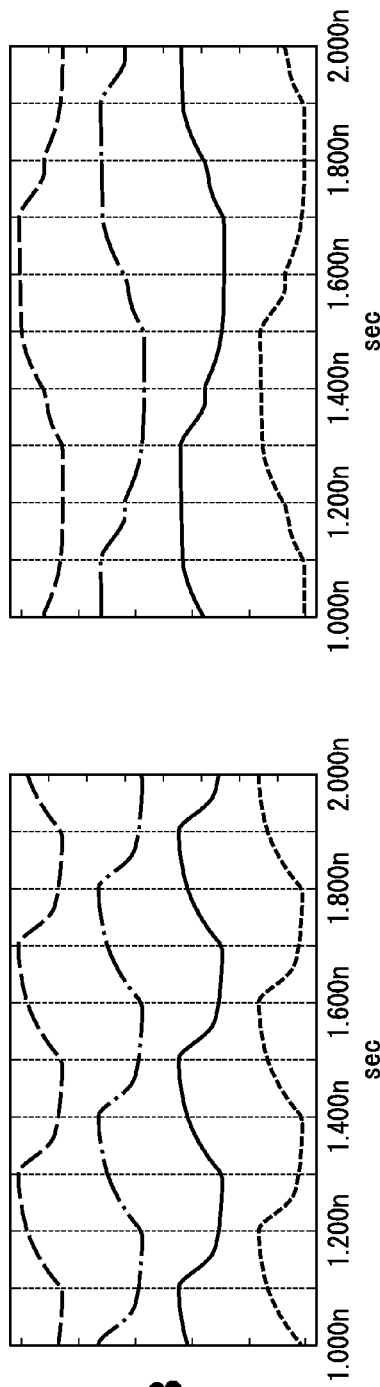
FIG. 13A
FIG. 13B

POLYPHASE CLOCK GENERATOR

BACKGROUND OF THE INVENTION

1. Field of the Invention

The present invention relates to a polyphase clock generator that is able to generate a polyphase clock signal based on reference clock signals having different phases. In particular, the present invention relates to a polyphase clock generator for use in clock data recovery (CDR) in transmission and reception of digital signals.

The present application claims priority on Japanese Patent Application No. 2011-183290, the content of which is incorporated herein by reference.

2. Description of the Related Art

In order to transmit and receive digital signals between LSI chips, it is necessary for a receiver to determine data bits at correct timings. For this reason, it is necessary to arrange an exclusive signal line of transmitting a timing signal (or a clock signal) independently of other signal lines for transmitting data signals. Herein, a timing signal line should be wired along data signal lines, and therefore it is necessary to implement wiring occupying a relatively large area on a substrate.

Recently, a high-speed serial transmission and reception system precluding a timing signal line has been developed with a transmitter which superposes a timing signal on data signals and a receiver which detects edges of data signals and adjusts the phase of an internal reference clock so as to recover timing information. This process is generally referred to as clock data recovery (CDR). A receiver may include a CDR circuit for use in clock data recovery.

The configuration of a CDR circuit can be realized according to a phase synchronization method (e.g. a Phase-Locked Loop (PLL) method), a ring oscillator method, and a phase interpolation method. Each method has its own merits and demerits. There is a recently increasing tendency that a digital signal transmission and reception system employs a CDR circuit according to the phase interpolation method. PLT 1 discloses a polyphase clock generator that is able to generate a polyphase clock signal having an arbitrary phase by way of phase interpolation on reference clock signals having different phases.

FIG. 11 is a block diagram showing an example of a polyphase clock generator 9 installed in a CDR circuit. The polyphase clock generator 9 includes a four-to-eight (4/8) phase converter 91, a phase selector 92, and a CDR controller 93.

The 4/8 phase converter 91 receives four reference clock signals IN000, IN090, IN180, and IN270 from an external circuit (not shown). Herein, the reference clock signals IN090, IN180, IN270 have the same frequency as the reference clock signal IN000 with phase differences of 90°, 180°, 270° relative to the reference clock signal IN000. Based on the four reference clock signals IN000, IN090, IN180, and IN270, the 4/8 phase converter 91 produces eight clock signals OUT0 to OUT7 which have the same frequency as the reference clock signals IN000, IN090, IN180, IN270 but with different phases. The 4/8 phase converter 91 includes buffers 911-1 to 911-4, delay buffers 912-1 to 912-4, and phase interpolators (PI) 913-1 to 913-4.

Specifically, the reference clock signals IN000 and IN180 are supplied to the phase interpolators 913-1 and 913-4 via the buffer 911-1. Additionally, the reference clock signals IN000 and IN180 are supplied to the phase interpolators 913-1 and 913-2 via the buffer 911-2 and the delay buffers 912-1 and 912-2. A phase difference of 45° is applied between the reference clock signals IN000 and IN180 while passing through the delay buffers 912-1 and 912-2.

The reference clock signals IN090 and IN270 are supplied to the phase interpolators 913-2 and 913-3 via the buffer 911-3. Additionally, the reference clock signals IN090 and IN270 are supplied to the phase interpolators 913-3 and 913-4 via the buffer 911-4 and the delay buffers 912-3 and 912-4. A phase difference of 45° is applied between the reference clock signals IN090 and IN270 while passing through the delay buffers 912-3 and 912-4.

The phase interpolators 913-1 to 913-4 multiplex four reference clock signals IN000 to IN270, which are supplied thereto via the buffers 911-1 to 911-4 and the delay buffers 912-1 to 912-4, so as to produce eight clock signals OUT1 to OUT7 with different phases.

The phase selector 92 includes a selector 921 and phase interpolators 922-1 to 922-4. Under control of the CDR controller 93, the selector 921 selectively combines eight clock signals OUT0 to OUT7, which are received from the 4/8 phase converter 91, so as to produce combined clock signals subsequently supplied to the phase interpolators 922-1 to 922-4. The phase interpolators 922-1 to 922-4 further combine the combined clock signals, which are received from the selector 921, so as to produce eight clock signals CLK000, CLK045, CLK090, CLK135, CLK 180, CLK225, CLK270, and CLK315 with difference phases.

Based on edge samples and data samples which are sampled with a CDR circuit (not shown), the CDR controller 93 generates control signals SELC and SELP to the phase selector 92, thus controlling the phases of the clock signals CLK00 to CLK315.

The polyphase clock generator 9 utilizes the functions of the phase interpolators 913-1 to 913-4 and the interpolators 922-1 to 922-4, each of which is able to generate an intermediate phase signal having an intermediate phase between the phases of two signals. In the output stage of circuitry, the phase interpolators 922-1 to 922-4 generate the consecutive phases of clock signals by way of combinations of combined clock signals output from the selector 921.

Each of the phase interpolators 913-1 to 913-4 and 922-1 to 922-4 has a function of generating a clock signal with an intermediate phase combining two clock signals, wherein each phase interpolator should be optimized in terms of the size of transistors (e.g. a ratio of width (W)/length (L)) fabricated therein as well as a leading time and a trailing time of a clock signal supplied thereto in conformity with a clock frequency which is determined in the design stage.

When the polyphase clock generator 9 designed based on a high clock frequency is utilized in a low clock frequency range, it is necessary to arrange a frequency divider following the polyphase clock generator 9. FIG. 12 is a block diagram showing an example of a polyphase clock generator 9A adapted to a plurality of clock frequencies, wherein parts identical to those shown in FIG. 11 are denoted using the same reference signs. The polyphase clock generator 9A includes a 1/2 frequency divider 94 following the same configuration as the polyphase clock generator 9.

The polyphase clock generator 9A produces eight clock signals CLK000, CLK045, CLK090, CLK135, CLK180, CLK225, CLK270, and CLK315, wherein the frequency divider 94 should implement a frequency dividing function adapted to eight clock signals, which in turn increases power consumption and a circuit mounting area on a chip. Generally speaking, when a phase interpolator receives two clock signals with phases which are lower than the clock frequency (which is determined in the design stage), it may undergo an increasing phase difference between two clock signals so that the output waveform thereof may be increasingly distorted. In the worst scenario, a phase interpolator may produce an output waveform including stepwise differences, thus degrading jitter characteristics.

FIGS. 13A and 13B show examples of output waveforms of phase interpolators involving distortions. These waveforms are measured using a phase interpolator with a clock frequency of 2.5 GHz, which is adjusted in the frequency to produce output signals (fout) at 2.5 GHz and 1.25 GHz. The output waveforms of FIG. 13B are softened or dulled compared to the output waveforms of FIG. 13A. FIG. 13A shows stepwise differences occurring during variations of output signals at fout=1.25 GHz. FIG. 13B shows output waveforms which are dulled in order to reduce stepwise differences occurring during variations of output signals, thus significantly degrading jitter characteristics.

CITATION LIST

Patent Literature

PLT 1: Japanese Patent Application Publication No. 2011-97314

Non Patent Literature

NPL 1: "Digital System Engineering, Application" written by William J. Dally, John W. Poulton, translated by Tadahiro Kuroda, published by Mazuzen, March of the fifteen year of Heisei period, pp. 759-762

SUMMARY OF THE INVENTION

It is an object of the present invention to provide a polyphase clock generator that is adapted to a plurality of clock frequencies without increasing its circuit scale and without degrading jitter characteristics of output signals.

The present invention relates to a polyphase clock generator operating based on a plurality of reference clock signals with different phases (e.g. 90° intervals) at a clock frequency. The polyphase clock generator includes a plurality of delay paths through which the reference clock signals are selectively delayed with different delay times; a plurality of switches that switch over a plurality of delay paths so as to select a group of delay paths suited to the clock frequency; and a plurality of phase interpolators that interpolate the delayed reference clock signals, passing through the selected group of delay paths, into the reference clock signals, thus generating a plurality of clock signals with a predetermined phase difference (e.g. a phase difference of 45°) therebetween.

Additionally, the present invention refers to a polyphase clock generating method including the steps of: receiving a plurality of reference clock signals with different phases at a clock frequency; selectively delaying the reference clock signals with a plurality of delay paths having different delay times; switching over a plurality of delay paths so as to select a group of delay paths suited to the clock frequency; and interpolating the delayed reference clock signals, passing through the selected group of delay paths, into the reference clock signals, thus generating a plurality of clock signals with a predetermined phase difference therebetween.

In this connection, a phase selector following the polyphase clock generator selectively combines a plurality of clock signals with a mixing ratio according to clock data recovery, thus generating a plurality of recovery clock signals with a precise phase difference (e.g. 45°) therebetween.

According to the present invention, a plurality of reference clock signals with a phase difference of 90° therebetween is selectively delayed while passing through a group of delay paths which is selected according to the clock frequency (e.g. 2.5 GHz, 1.25 GHz). This makes it possible to precisely maintain a constant phase difference between the delayed reference clock signals and the reference clock signals in accordance with the clock frequency. Then, the phase interpolators interpolate the delayed reference clock signals into the reference clock signals so as to generate a plurality of clock signals. Thus, it is possible to prevent the occurrence of stepwise differences in variations of output waveforms corresponding to clock signals, thus preventing degradation of jitter characteristics in output waveforms. Additionally, the present invention is able to cope with a plurality of clock frequencies without installing frequency dividers; hence, it is possible to suppress an increasing circuit scale.

BRIEF DESCRIPTION OF THE DRAWINGS

These and other objects, aspects, and embodiments of the present invention will be described in more detail with reference to the following drawings.

FIG. 8 is a binary code transition table describing combinations of binary codes of control signals output from a CDR controller included in the polyphase clock generator in relation to steps.

FIG. 13A show output waveforms with stepwise distortions, which are produced with a phase interpolator for use in a polyphase clock generator, at different frequencies of 2.5 GHz and 1.25 GHz.

FIG. 13B show output waveforms with degraded jitter characteristics, which are produced with a phase interpolator for use in a polyphase clock generator, at different frequencies of 2.5 GHz and 1.25 GHz.

DESCRIPTION OF THE PREFERRED EMBODIMENT

The present invention will be described in further detail by way of examples with reference to the accompanying drawings.

Figure 1:
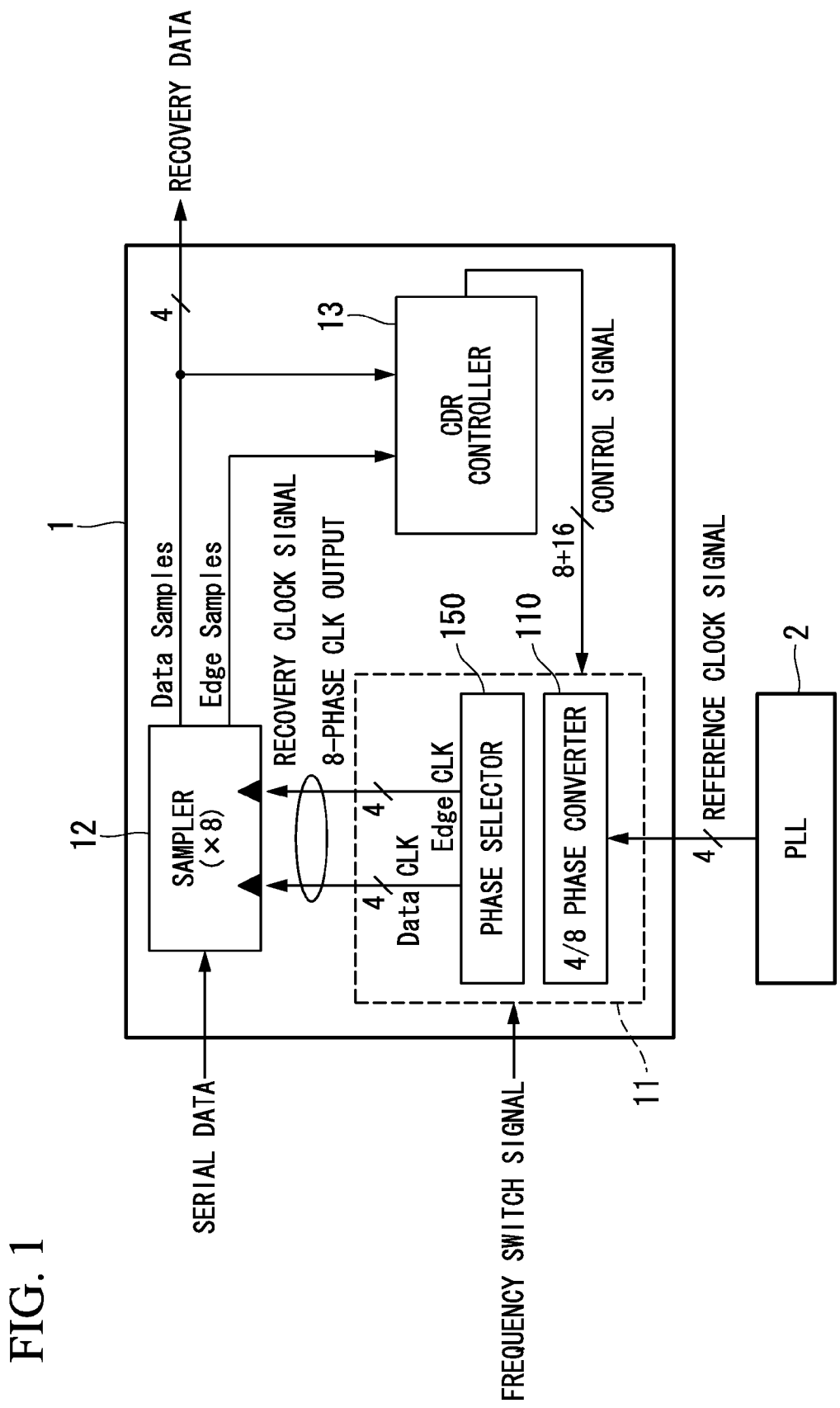
FIG. 1 is a block diagram of a CDR circuit coupled with a PLL circuit according to a preferred embodiment of the present invention.

FIG. 1 is a block diagram of a CDR circuit 1 coupled with a PLL circuit 2 according to a preferred embodiment of the present invention. The CDR circuit 1 receives serial data and a frequency switch signal from an external device (not shown). Additionally, the CDR circuit 1 receives a four-phase reference clock signal from the PLL circuit 2 which is installed in a receiver (not shown). The four-phase reference clock signal includes one reference clock signal indicating a reference phase, and three reference clock signals with phase differences of 90°, 180°, 270° relative to the reference phase. Based on the frequency switch signal and the four-phase reference clock signal, the CDR circuit 1 detects edges and data bits included in serial data so as to output the read data bits as recovery data. The frequency switch signal indicates the frequency of an input reference clock signal.

The CDR circuit 1 includes a polyphase clock generator 11, a sampler 12, and a CDR controller 13. Based on the frequency switch signal and the four-phase reference clock signal as well as a control signal from the CDR controller 13, the polyphase clock generator 11 produces an eight-phase output clock signal indicating a four-phase data clock signal and a four-phase edge clock signal. Based on the eight-phase output clock signal (or a recovery clock signal) from the polyphase clock generator 11, the sampler 12 samples serial data so as to produce edge samples and data samples. The sampler 12 output data samples to an external device (not shown) as recovery data.

Based on edge samples and data samples output from the sampler 12, the CDR controller 13 determines the optimum phase of a recovery clock signal for sampling serial data. Additionally, the CDR controller 13 sends a control signal to the polyphase clock generator 11 such that the polyphase clock generator 11 will produce a recovery clock signal matching with the determined phase.

Figure 2:
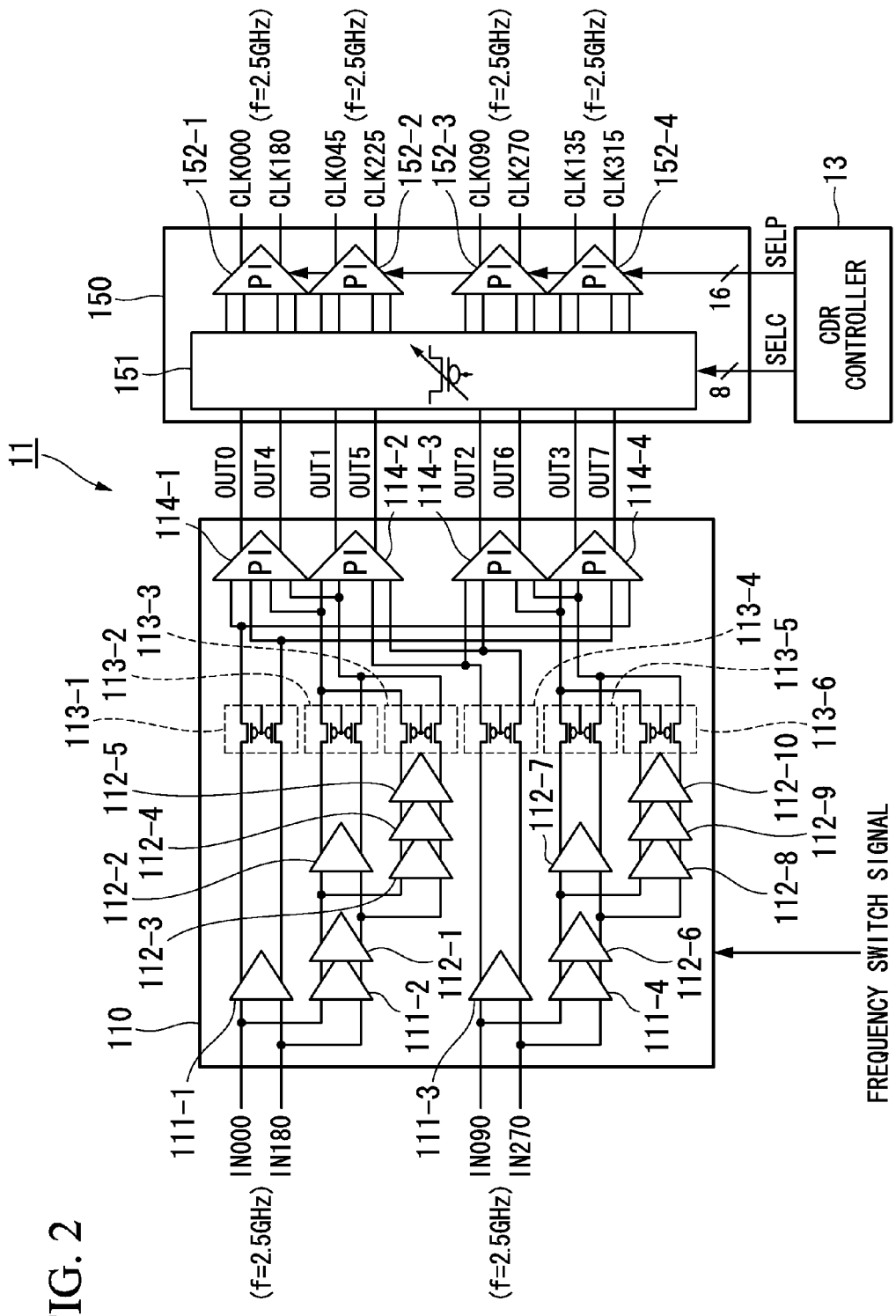
FIG. 2 is a block diagram of a polyphase clock generator installed in the CDR circuit.

FIG. 2 is a block diagram of the polyphase clock generator 11 according to the preferred embodiment of the present invention. The polyphase clock generator 11 includes a four-to-eight (4/8) phase converter 110, a phase selector 150. The polyphase clock generator 11 is adapted to two clock frequencies of 2.5 GHz and 1.25 GHz.

Based on the frequency switch signal and the four-phase reference clock signal, the 4/8 phase converter 110 produces eight clock signals OUT0 to OUT7 with different phases. The four-phase reference clock signal includes one clock signal IN000 indicating a reference phase and three clock signals IN090, IN180, IN270 with phase differences of 90°, 180°, 270° relative to the reference phase.

The 4/8 phase converter 110 includes buffers 111-1 to 111-4, delay buffers 112-1 to 112-10, switches 113-1 to 113-6, and phase interpolators 114-1 to 114-4. The switches 113-1 to 113-6 are each configured of a pass switch using a P-channel MOS transistor.

Specifically, the buffer 111-1 receives clock signals IN000, IN180 so as to send them to the switch 113-1. The switch 113-1 is turned on or off in response to the frequency switch signal. When turned on, the switch 113-1 delivers clock signals IN000, IN180 (from the buffer 111-1) to the phase interpolators 114-1, 114-4. When turned off, the switch 113-1 shuts off transmission between the buffer 111-1 and the phase interpolators 114-1, 114-4.

The buffer 111-2 receives clock signals IN000, IN180 so as to send them to the delay buffer 112-1. The delay buffer 112-1 delays clock signals IN000, IN180 (from the buffer 111-2) so as to deliver the delayed clock signals IN000, IN180 to the delay buffers 112-2, 112-3.

The delay buffer 112-2 further delays the clock signals IN000, IN180 (which are delayed by the delay buffer 112-1) so as to send the further delayed clock signals IN000, IN180 to the switch 113-2. The switch 113-2 is turned on or off in response to the frequency switch signal. When turned on, the switch 113-2 delivers the clock signals IN000, IN180 (which are further delayed by the delay buffer 112-2) to the phase interpolator 114-1, 114-2. When turned off, the switch 113-2 shuts off transmission between the delay buffer 112-2 and the phase interpolator 114-1, 114-2.

The delay buffer 112-3 further delays the clock signals IN000, IN180 (which are delayed by the delay buffer 112-1) so as to send the further delayed clock signals IN000, IN180 to the switch 113-3 via the delay buffers 112-4, 112-5. The switch 113-3 is turned on or off in response to the frequency switch signal. When turned on, the switch 113-3 delivers the further delayed clock signals IN000, IN180 (which are further delayed by the delay buffer 112-5) to the phase interpolators 114-1, 114-2. When turned off, the switch 113-3 shuts down transmission between the delay buffer 112-5 and the phase interpolators 114-1, 114-2.

The buffer 111-3 receives clock signals IN090, IN270 so as to send them to the switch 113-4. The switch 113-4 is turned on or off in response to the frequency switch signal. When turned on, the switch 113-4 delivers clock signals IN090, IN270 (from the buffer 111-3) to the phase interpolators 114-2, 114-3. When turned off, the switch 113-4 shuts off transmission between the buffer 111-3 and the phase interpolators 114-2, 114-3.

The buffer 111-4 receives clock signals IN090, IN270 so as to send them to the delay buffer 112-6. The delay buffer 112-6 delays clock signals IN090, IN270 (from the buffer 111-4) so as to deliver the delayed clock signals IN090, IN270 to the delay buffers 112-7, 112-8.

The delay buffer 112-7 further delays the clock signals IN090, IN270 (which are delayed by the delay buffer 112-6) so as to deliver the further delayed clock signals IN090, IN270 to the switch 113-5. The switch 113-5 is turned on or off in response to the frequency switch signal. When turned on, the switch 113-5 delivers the further delayed clock signals IN090, IN270 (which are further delayed by the delay buffer 112-7) to the phase interpolators 114-3, 114-4. When turned off, the switch 113-5 shuts off transmission between the delay buffer 112-7 and the phase interpolators 114-3, 114-4.

The delay buffer 112-8 further delays the clock signals IN090, IN270 (which are delayed by the delay buffer 112-6) so as to send the further delayed clock signals IN090, IN270 to the switch 113-6 via the delay buffers 112-9, 112-10. The switch 113-6 is turned on or off in response to the frequency switch signal. When turned on, the switch 113-6 delivers the further delayed clock signals IN090, IN270 (which are further delayed by the delay buffer 112-10) to the phase interpolators 114-3, 114-4. When turned off, the switch 113-6 shuts off transmission between the delay buffer 112-10 and the phase interpolators 114-3, 114-4.

The buffers 111-1 to 111-4 are each configured of a buffer according to CML (i.e. Current Mode Logic). They are arranged to prevent propagation of switching noise which occurs when the switched 113-1 to 113-6 are turned on or off.

It is possible to omit the buffers 111-1 to 111-4 from the circuitry if the switches 113-1 to 113-6 cause switching noise having a small impact on the circuitry.

All the delay buffers 112-1 to 112-10 have the same delay value. A delay path, leading to the phase interpolators 114-1, 114-2 via the delay buffers 112-1, 112-2 from the buffer 111-2, delays clock signals IN000, IN180 with a phase delay of 45° relative to the clock frequency of 2.5 GHz.

A delay path, leading to the phase interpolators 114-1, 114-2 via the delay buffers 112-1, 112-3 to 112-5 from the buffer 111-2, delays clock signals IN000, IN180 with a phase delay of 45° relative to the clock frequency of 1.25 GHz.

A delay path, leading to the phase interpolators 114-3, 114-4 via the delay buffers 112-6, 112-7 from the buffer 111-4, delays clock signals IN090, IN270 with a phase delay of 45° relative to the clock frequency of 2.5 GHz.

A delay path, leading to the phase interpolators 114-3, 114-4 via the delay buffers 112-6, 112-8 to 112-10 from the buffer 111-4, delays clock signals IN090, IN270 with a phase delay of 45° relative to the clock frequency of 1.25 GHz.

In the case of the clock frequency of 2.5 GHz, the switches 113-1 to 113-6 receive clock signals IN000 to IN270 at 2.5 GHz. In this case, the switches 113-1, 113-2, 113-4, 113-5 are turned on while the switches 113-3, 113-6 are turned off in response to the frequency switch signal. In the case of the clock frequency of 1.25 GHz, the switches 113-1 to 113-6 receive clock signals IN000 to IN270 at 1.25 GHz. In this case, the switches 113-1, 113-3, 113-4, 113-6 are turned on while the switches 113-2, 113-3 are turned off in response to the frequency switch signal.

The phase interpolator 114-1 receives clock signals IN000, IN180 via the switch 113-1 while receiving the delayed clock signals IN000, IN180 with a phase delay of 45° via the switch 113-2 or 113-3. The phase interpolator 114-1 combines the clock signal IN000 and the delayed clock signal IN000 with a phase delay of 45° so as to produce a clock signal OUT0. Additionally, the phase interpolator 114-1 combines the clock signal IN180 and the delayed clock signal IN180 with a phase delay of 45° so as to produce a clock signal OUT4.

The phase interpolator 114-2 receives the clock signal IN000, IN180 with a phase delay of 45° via the switch 113-2 or 113-3 while receiving the clock signals IN090, IN270 via the switch 113-4. The phase interpolator 114-2 combines the clock signal IN090 and the delayed clock signal IN000 with a phase delay of 45° so as to produce a clock signal OUT1. Additionally, the phase interpolator 114-2 combines the clock signal IN270 and the delayed clock signal IN180 with a phase delay of 45° so as to produce a clock signal OUT5.

The phase interpolator 114-3 receives the clock signals IN090, IN270 via the switch 113-4 while receiving the delayed clock signals IN090, IN270 with a phase delay of 45° via the switch 113-5 or 113-6. The phase interpolator 114-3 combines the clock signal IN090 and the delayed clock signal IN090 with a phase delay of 45° so as to produce a clock signal OUT2. Additionally, the phase interpolator 114-3 combines the clock signal IN270 and the delayed clock signal IN270 with a phase delay of 45° so as to produce a clock signal OUT6.

The phase interpolator 114-4 receives the clock signals IN000, IN180 via the switch 113-1 while receiving the delayed clock signals IN090, IN270 with a phase delay of 45° via the switch 113-5 or 113-6. The phase interpolator 114-4 combines the clock signal IN180 and the delayed clock signal IN090 with a phase delay of 45° so as to produce a clock signal OUT3. Additionally, the phase interpolator 114-4 combines the clock signal IN000 and the delayed clock signal IN270 with a phase delay of 45° so as to produce a clock signal OUT7.

Figure 3:
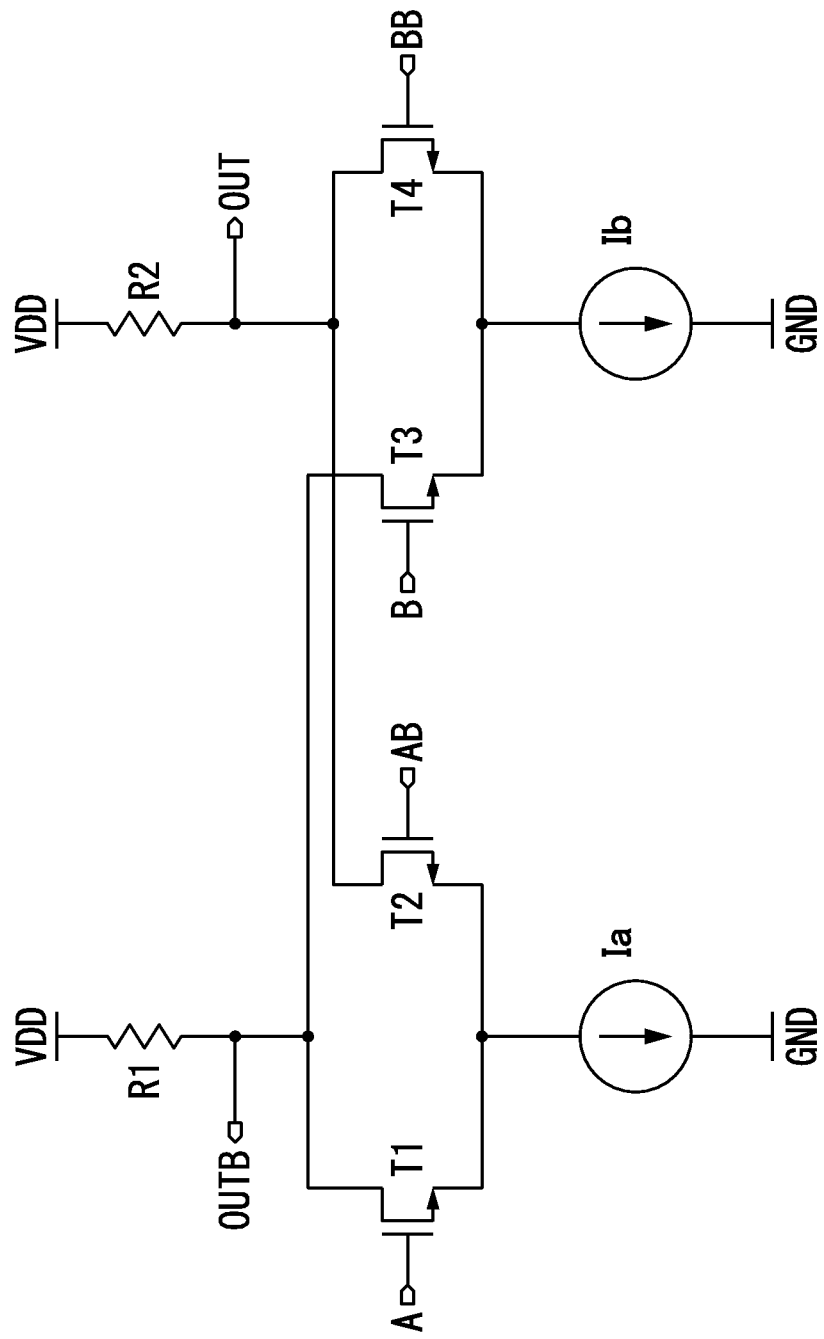
FIG. 3 is a circuit diagram showing an example of configuration of a phase interpolator included in the polyphase clock generator.

FIG. 3 is a circuit diagram showing an example of configuration of a phase interpolator 114 (representing the phase interpolators 114-1 to 114-4). The phase interpolator 114 includes N-channel MOS transistors T1 to T4, resistors R1, R2, and current sources Ia, Ib. The drains of the transistors T1, T3 are connected in common to a source voltage VDD via the resistor R1. The drains of the transistors T2, T4 are connected in common to the source voltage VDD via the resistor R2. The sources of the transistors T1, T2 are connected in common to the current source Ia which is grounded (GND). The sources of the transistors T3,T4 are connected in common to the current source Ib which is grounded (GND).

The gates of the transistor T1 is connected to an input terminal A. The gate of the transistor T2 is connected to an input terminal AB. The gate of the transistor T3 is connected to an input terminal B. The gate of the transistor T4 is connected to an input terminal BB. An output terminal OUTB is connected between the resistor R1 and the commonly connected drains of the transistors T1, T3. An output terminal OUT is connected between the resistor R2 and the commonly connected drains of the transistors T2, T4.

The ratio of the gate width to the gate length (W1/L1) pertaining to the transistors T1, T3 is set to a predetermined ratio (e.g. 6:4). Similarly, the ratio of the gate width to the gate length (W2/L2) pertaining to the transistors T2, T4 is set to a predetermined ratio (e.g. 6:4). Additionally, the ratio of currents Ia, Ib (supplied with the current sources Ia, Ib) is set to the predetermined ratio. Thus, an input signal of the input terminal A is combined with an input signal of the input terminal B at the predetermined ratio, and therefore the combined signal is outputted from the output terminal OUTB. Additionally, an input signal of the input terminal AB is combined with an input signal of the input terminal BB at the predetermined ratio, and therefore the combined signal is outputted from the output terminal OUT.

In the case of the phase interpolator 114-1, for example, the clock signal IN000 is supplied to the input terminal A; the delayed clock signal IN000 with a phase delay of 45° is supplied to the input terminal B; the clock signal IN180 is supplied to the input terminal AB; the delayed clock signal IN180 with a phase delay of 45° is supplied to the input terminal BB. Thus, the phase interpolator 114-1 outputs the clock signal OUT0 at the output terminal OUTB and the clock signal OUT4 at the output terminal OUT. The operating principle of a phase interpolator is generally known and described in various documents such as NPL1; hence, the details thereof will not be described.

In the 4/8 phase converter 110 having the aforementioned configuration, the delay buffers 112-1 to 112-10 produce the delayed clock signals IN000, IN090, IN180, IN270 with a phase delay of 45°, while the phase interpolators 114-1 to 114-4 combines the waveforms of the clock signals IN000, IN090, IN180, IN270 with the waveforms of the delayed clock signals IN000, IN090, IN180, IN270, thus precisely producing eight clock signals OUT0 to OUT7 with different phases.

Referring back to FIG. 2, the configuration of the polyphase clock generator 11 will be described in detail. In response to control signals from the CDR controller 13, the phase selector 150 generates output clock signals CLK000, CLK045, CLK090, CLK135, CLK180, CLK225, CLK270, CLK315 based on clock signals OUT0 to OUT7. The phase selector 150 includes a selector 151 and phase interpolators 152-1 to 152-4. The CDR controller 13 generates two clock signals, i.e. a signal SELC for controlling the phase selector 150 and a signal SELP for controlling the phase interpolators 152-1 to 152-4.

In response to the signal SELC from the CDR controller 13, the selector 151 selectively combines four clock signals, among clock signal OUT0 to OUT7 from the 4/8 phase converter 110, so as to produce four combinations of clock signals, which are supplied to the phase interpolators 152-1 to 152-4.

Specifically, the selector 151 selectively combines four clock signals among clock signals OUT0 to OUT7 from the 4/8 phase converter 110, as follows.

A combination of clock signals OUT0, OUT4, OUT1, OUT5 is supplied to the phase interpolator 152-1; a combination of clock signals OUT1, OUT5, OUT2, OUT6 is supplied to the phase interpolator 152-2; a combination of clock signals OUT2, OUT6, OUT3, OUT7 is supplied to the phase interpolator 152-3; a combination of clock signals OUT3, OUT7, OUT4, OUT0 is supplied to the phase interpolator 152-4.

That is, the selector 151 selectively combines two out of four pairs of clock signals (i.e. a pair of clock signals OUT0, OUT4; a pair of clock signals OUT1, OUT5; a pair of clock signals OUT2 OUT6; and a pair of clock signals OUT3, OUT7) in different orders so as to produce four combinations, each combining two pairs of clock signals, in response to the signal SELC. Thus, four series of clock signals are supplied to the phase interpolators 152-1 to 152-4. The phase interpolators 152-1 to 152-4 combines four series of clock signals in response to the signal SELP.

Figure 4A:
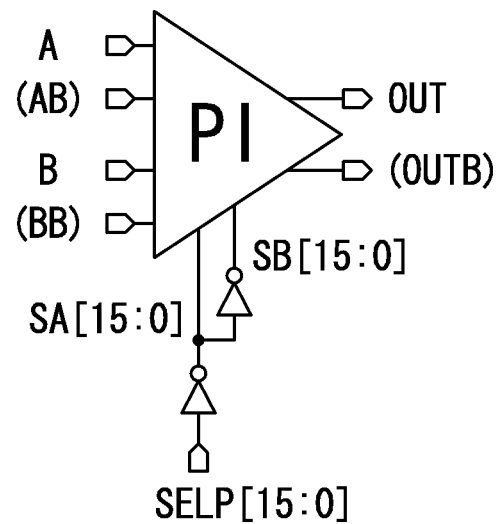
FIG. 4A is a circuit diagram of a phase interpolator for use in the polyphase clock generator.
Figure 4B:
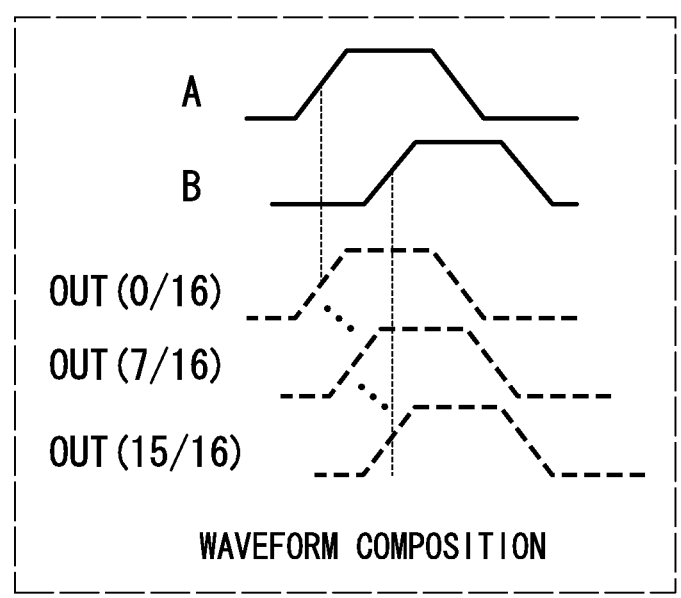
FIG. 4B shows input/output waveforms adapted to the phase interpolator shown in FIG. 4A.

FIG. 4A is a circuit diagram of a phase interpolator (PI) 152 (representing the phase interpolators 152-1 to 152-4), and FIG. 4B shows input/output waveforms applied to the phase interpolator 152. The phase interpolator 152 receives and interpolates two series of clock signals having different phases, thus producing an intermediate phase signal. The phase interpolator 152 interpolates input signals A, B at a ratio specified by the signal SELP, thus producing an intermediate phase signal. When the signal SELP[15:0] indicates a value (0/16), for example, the phase interpolator 152 combines input signals A, B at a ratio of 1:0, thus outputting the input signal A. When the signal SELP[15:0] indicates a value (7/16), the phase interpolator 152 combines input signals A, B at a ratio of 1:1, thus producing a signal with an intermediate phase between the phases of input signals A, B.

The phase interpolator 152 normally receives delayed clock signals with a phase delay of 45° (in other words, clock signals with intermediate phases) from the selector 151, wherein the phase interpolator 152 switches over those signals differently in sixteen steps in response to the signal SELP[15:0]. When the phase interpolator 152 is designed with sixteen steps, the phase interpolator 152 exhibits a phase resolution of 2.8125° per each step (=45÷16 (steps)). When the CDR circuit 1 receives serial data at transmission speed of 10 Gbps, 1 UI (Unit Interval) corresponds to 100 [ps] where 45°=50 [ps]; hence, it is possible to finely adjust the clock phase at intervals of 3.125 [ps/step] (=50 [ps]÷16 (steps)). The phase interpolator 152 receives clock signals with a phase difference of 45° therebetween at the input terminal A (AB) and the input terminal B (BB), wherein the phase interpolator 152 selectively outputs a signal, whose phase is selected in response to control bits (SA, SB) specified by the signal SELP[15:0], at the output terminal OUT (OUTB).

Figure 5:
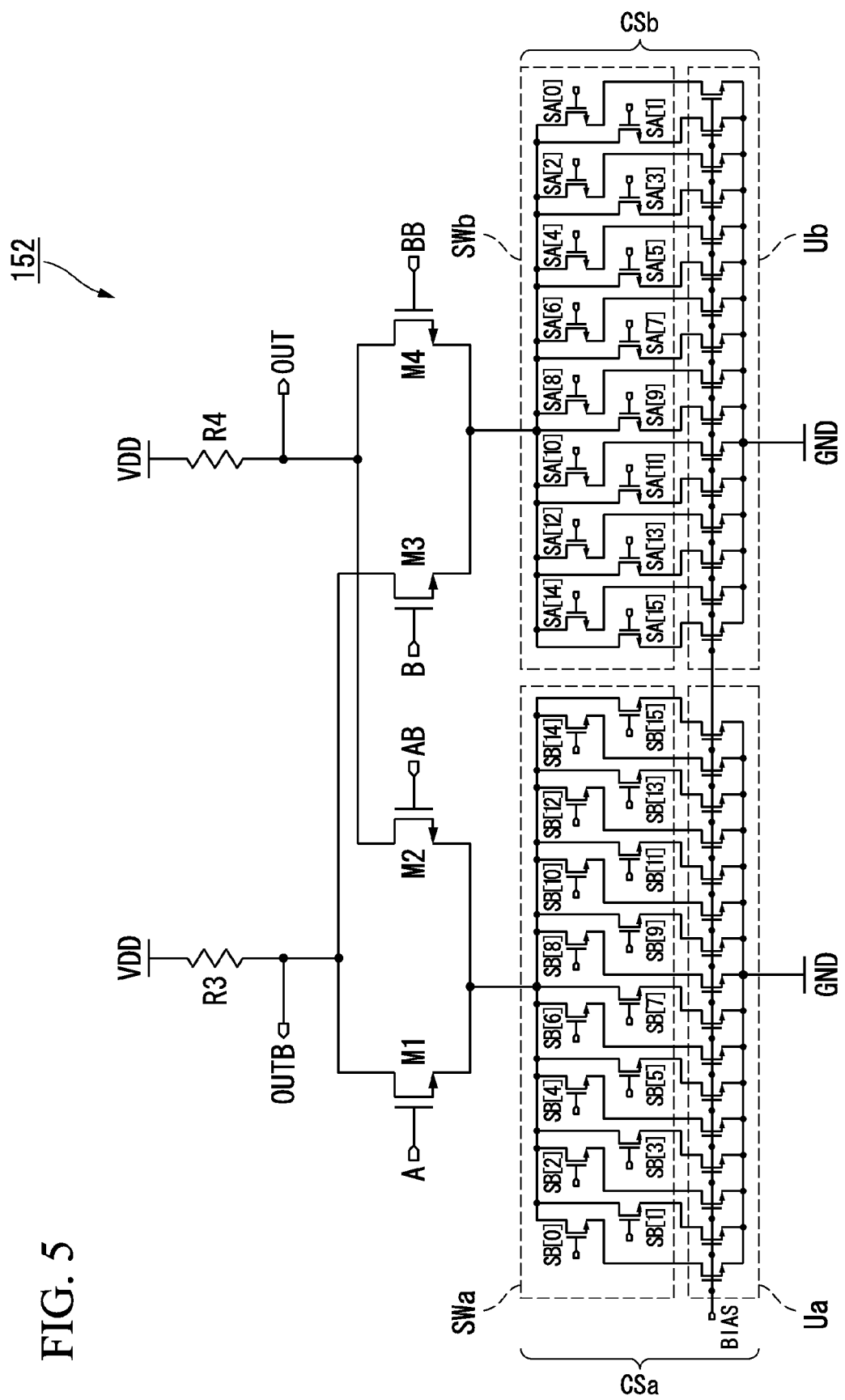
FIG. 5 is a circuit diagram showing the detailed configuration of the phase interpolator.

FIG. 5 is a circuit diagram showing the detailed configuration of the phase interpolator 152. The phase interpolator 152 includes N-channel MOS transistors M1 to M4, resistors R3, R4, a current source CSa (including switches SWa and a constant current source Ua), and a current source CSb (including switches SWb and a constant current source Ub). The drains of the transistors M1, M3 are connected in common to a source voltage VDD via the resistor R3, while the drains of the transistors M2, M4 are connected in common to the source voltage VDD via the resistor R4. The sources of the transistors M1, M2 are connected in common to the current source CSa, which is grounded. The sources of the transistors M3, M4 are connected in common to the current source CSb, which is grounded.

The gate of the transistor M1 is connected to the input terminal A; the gate of the transistor M2 is connected to the input terminal AB; the gate of the transistor M3 is connected to the input terminal B; the gate of the transistor M4 is connected to the input terminal BB. The output terminal OUTB is connected between the resistor R3 and the commonly-connected drains of the transistors M1, M3, while the output terminal OUT is connected between the resistor R4 and the commonly-connected drains of the transistors M2, M4.

The current source CSa includes the constant current source Ua, including sixteen unit current sources, and the current switches SWa, i.e. sixteen current switches for turning on or off sixteen unit current sources. The sixteen current switches SWa are correlated to sixteen control bits SB[15:0] in a one-to-one correspondence manner, wherein each current switch is turned on in response to the corresponding control bit of "1", but each current source is turned off in response to the corresponding control bit of "0".

The current source CSb has the same configuration as the current source CSa. That is, the current source CSb includes the constant current source Ub, including sixteen unit current sources, and the switches SWb, i.e. sixteen current switches for turning on or off sixteen unit current sources. The sixteen current switches SWb are correlated to sixteen control bits SA[15:0] in a one-to-one correspondence manner, wherein each current switch is turned on in response to the corresponding control bit of "1", but each current source is turned off in response to the corresponding control bit of "0".

The phase interpolator 152 controls the amplitude of a current flowing in the current source CSa and the amplitude of a current flowing in the current source CSb in response to the control bits SA, SB, wherein the sum of two amplitudes are maintained at a constant level. The potential of the output terminal OUT depends on the sum of a current flowing through the transistor M2 and a current flowing through the transistor M4. The potential of the output terminal OUTB depends on the sum of a current flowing through the transistor M1 and a current flowing through the transistor M3. Therefore, upon receiving clock signals with a phase difference of 45° therebetween at the input terminal A (AB) and the input terminal B (BB), the phase interpolator 152 outputs a clock signal with a phase depending on the control bits SA, SB at the output terminal OUT (OUTB). In this connection, the signal SELP (i.e. the control bits SA, SB) employs 16-bit thermometer codes; thus, it is possible to switch over the phase of an output clock signal in sixteen steps in response to the ratio of the number of switches SWa, which are turned on, to the number of switches SWb, which are turned on.

Figure 6:
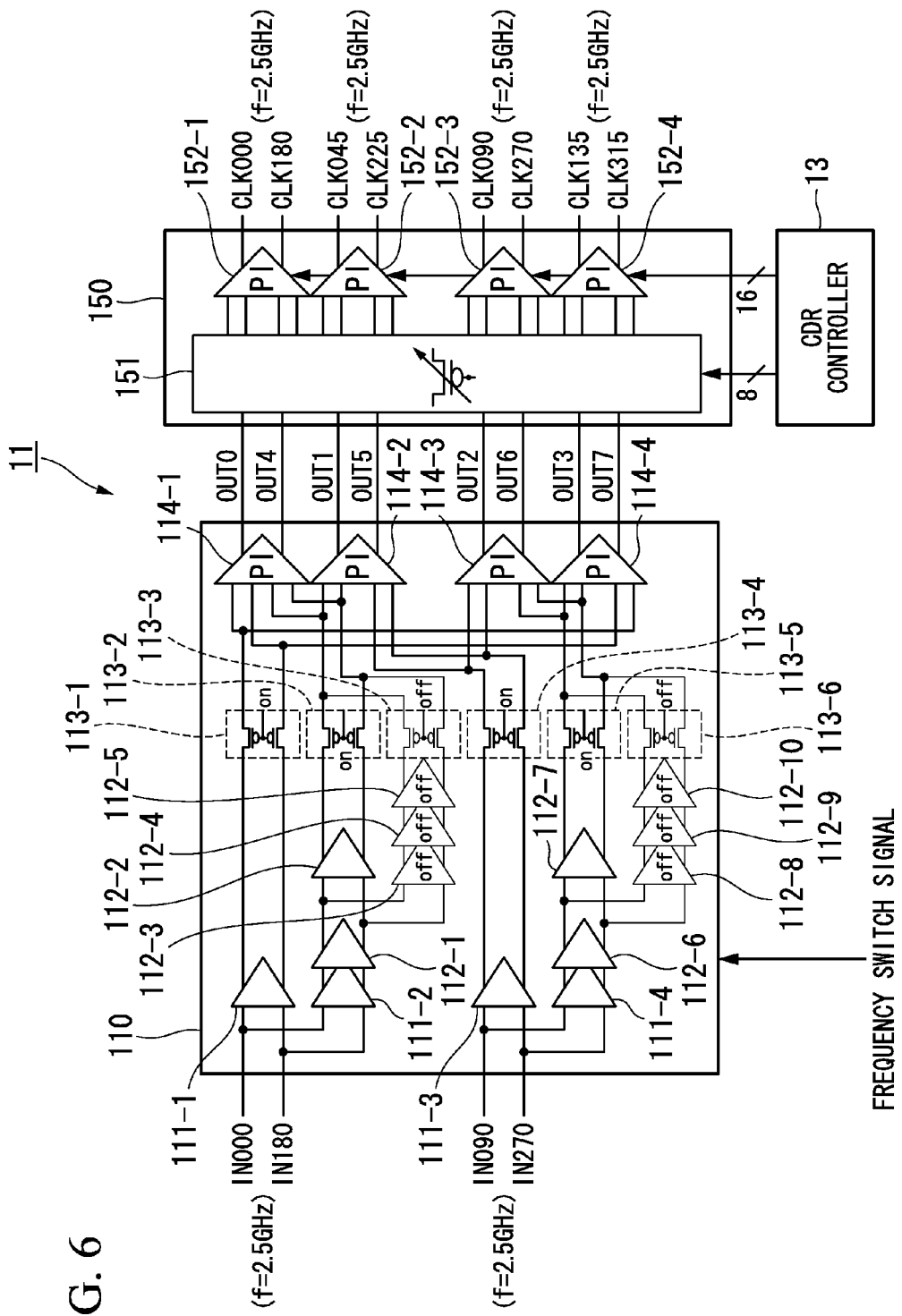
FIG. 6 is a block diagram showing an operating state of the polyphase clock generator at a clock frequency of 2.5 GHz.

Next, the operation of the polyphase clock generator 11 will be described in detail. FIG. 6 shows an operating state of the polyphase clock generator 11 at the clock frequency of 2.5 GHz. The polyphase clock generator 11 receives one reference clock signal IN000 and three reference clock signals IN090, IN180, IN270 with phase delays of 90°, 180°, 270° relative to the reference clock signal IN000. When the polyphase clock generator 11 operates at the clock frequency of 2.5 GHz, the 4/8 phase converter 110 turns on the switches

113-1, 113-2, 113-4, 113-5 while turning off the switches 113-3, 113-6 in response to a frequency switch signal.

At this time, the reference clock signals IN000, IN180 (received by the buffer 111-2) are delayed by the delay buffers 112-1, 112-2 with phase delays of 45° and then supplied to the phase interpolator 114-1, 114-2. Additionally, the reference clock signals IN090, IN270 (received by the buffer 111-4) are delayed by the delay buffers 112-6, 112-7 with phase delays of 45° and then supplied to the phase interpolator 114-3, 114-4. Thus, the 4/8 phase converter 110 generates clock signals with phase delays of 45°, 135°, 225°, 315° relative to the reference clock signal IN000. That is, the 4/8 phase converter 110 generates eight output clock signals OUT0 to OUT7 with different phases based on four reference clock signals IN000, IN090, IN180, IN270.

Figure 7:
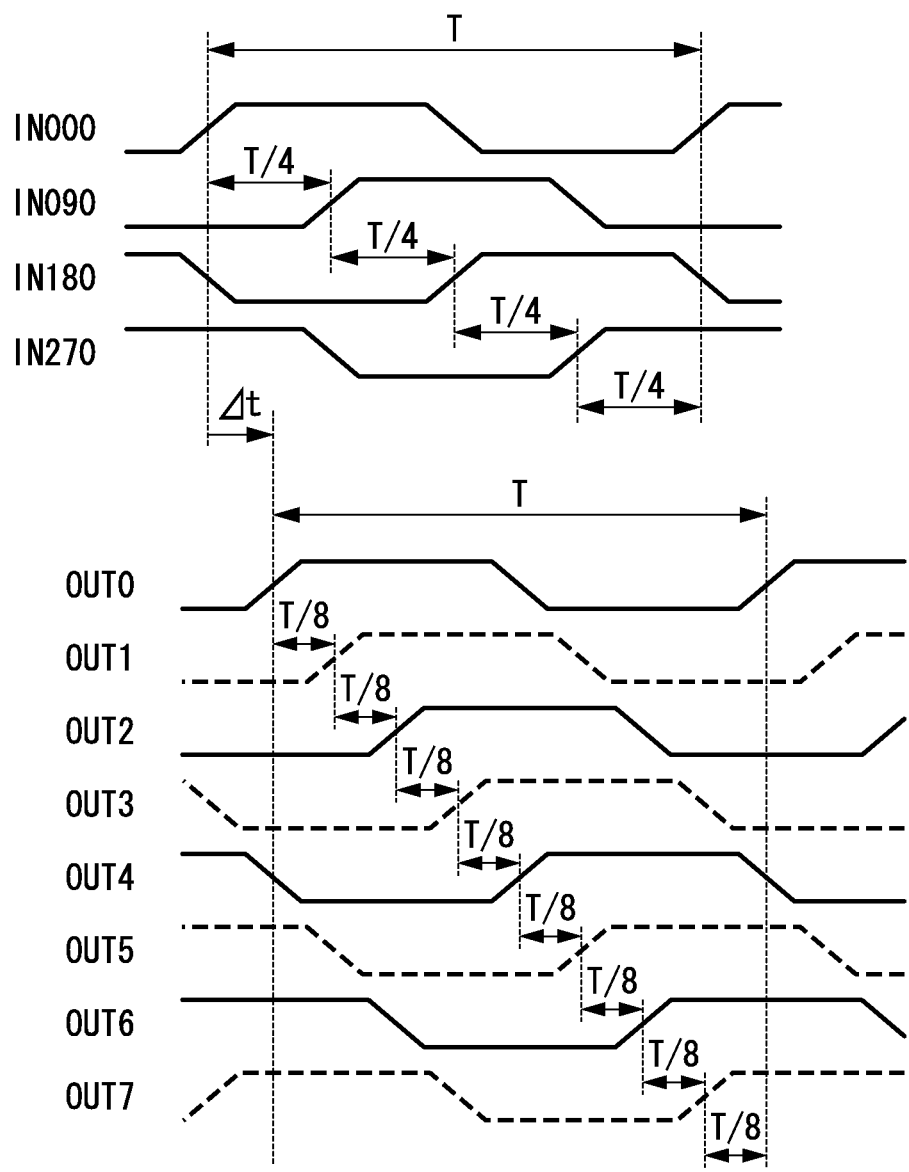
FIG. 7 is a graph showing the waveforms of reference clock signals and the waveforms clock signals, which are input to and output from a four-to-eight phase converter included in the polyphase clock generator.

FIG. 7 shows the waveforms of the reference clock signals IN000, IN090, IN180, IN270 input to the 4/8 phase converter 110 and the waveforms of the clock signals OUT0 to OUT7 output from the 4/8 phase converter 110, wherein the horizontal axis represents time while the vertical axis represents the amplitude of each clock signal. The 4/8 phase clock generator 110 produces the clock signals OUT0 to OUT7 having the same frequency corresponding to the clock frequency of 2.5 GHz which is set to the reference clock signal IN000, IN090, IN180, IN270. The clock signals OUT0 to OUT7 form the basis of sampling.

The 4/8 phase converter 110 delays the reference clock signal IN000, indicating the reference phase among the four reference clock signals, by Δt so as to generate the clock signal OUT0. Additionally, the 4/8 phase converter 110 generates the clock signals OUT1 to OUT7, which are sequentially delayed by one-eighth period (i.e. T/8) with reference to the clock signal OUT0. In this connection, the four reference clock signals are sequentially delayed by one-quarter period (i.e. T/4) so that the total delay time thereof is amounted to T. Correspondingly, the eight clock signals are sequentially delayed by one-eighth period so that the total delay time thereof is amounted to T. Thus, a set of four reference clock signals matches with a set of eight clock signals with a time delay of Δt therebetween.

In response to control signals output from the CDR controller 13, the phase selector 150 generates the eight output clock signals CLK000, CLK045, CLK090, CLK135, CLK180, CLK225, CLK270, CLK315, which serve as sampling clock signals, based on the four clock signals OUT0 to OUT7 output from the 4/8 phase converter 110.

The CDR controller 13 generates the control signals SELC, SELP, whose binary codes are changed as shown in FIG. 8. FIG. 8 is a binary code transition table describing combinations of binary codes of control signals SELC, SELP in connection with plenty of steps. Herein, an initial condition corresponds to a combination of the signal SELC=(00000011) and the signal SELP=(0000000000000000). The phase interpolator 152-1 receives the clock signal OUT0 (at the input terminal A) and the delayed clock signal OUT1 (at the input terminal B) with a phase difference of 45° therebetween. The phase interpolator 152-1 combines the clock signal OUT0 and the clock signal OUT1 at a ratio of 16:0 corresponding to the signal SELP=(0000000000000000). In other words, the phase interpolator 152-1 selectively outputs the clock signal OUT0 at the input terminal A.

Generally, the phase interpolator (PI) 152 increases a ratio of mixing the clock signal of the input terminal B with the clock signal of the input terminal A as the number of "1" included in the binary code of the signal SELP. Thus, the phase interpolator 152 mixes the clock signal of the input terminal A and the clock signal of the input terminal B at a ratio of 0:16 corresponding to the signal SELP= (1111111111111111), wherein the phase interpolator 152 selectively outputs the clock signal of the input terminal B. The CDR controller 13 changes the binary code of the signal SELC from (00000011) to (00000110) at the timing of the signal SELP=(1111111111111111).

The selector 151 sends a combination of clock signals OUT1, OUT5, OUT2, OUT6 to the phase interpolator 152-1, a combination of clock signals OUT2, OUT6, OUT3, OUT7 to the phase interpolator 152-2, a combination of clock signals OUT3, OUT7, OUT4, OUT0 to the phase interpolator 152-3, a combination of clock signals OUT4, OUT0, OUT5, OUT1 to the phase interpolator 152-4.

Figure 9:
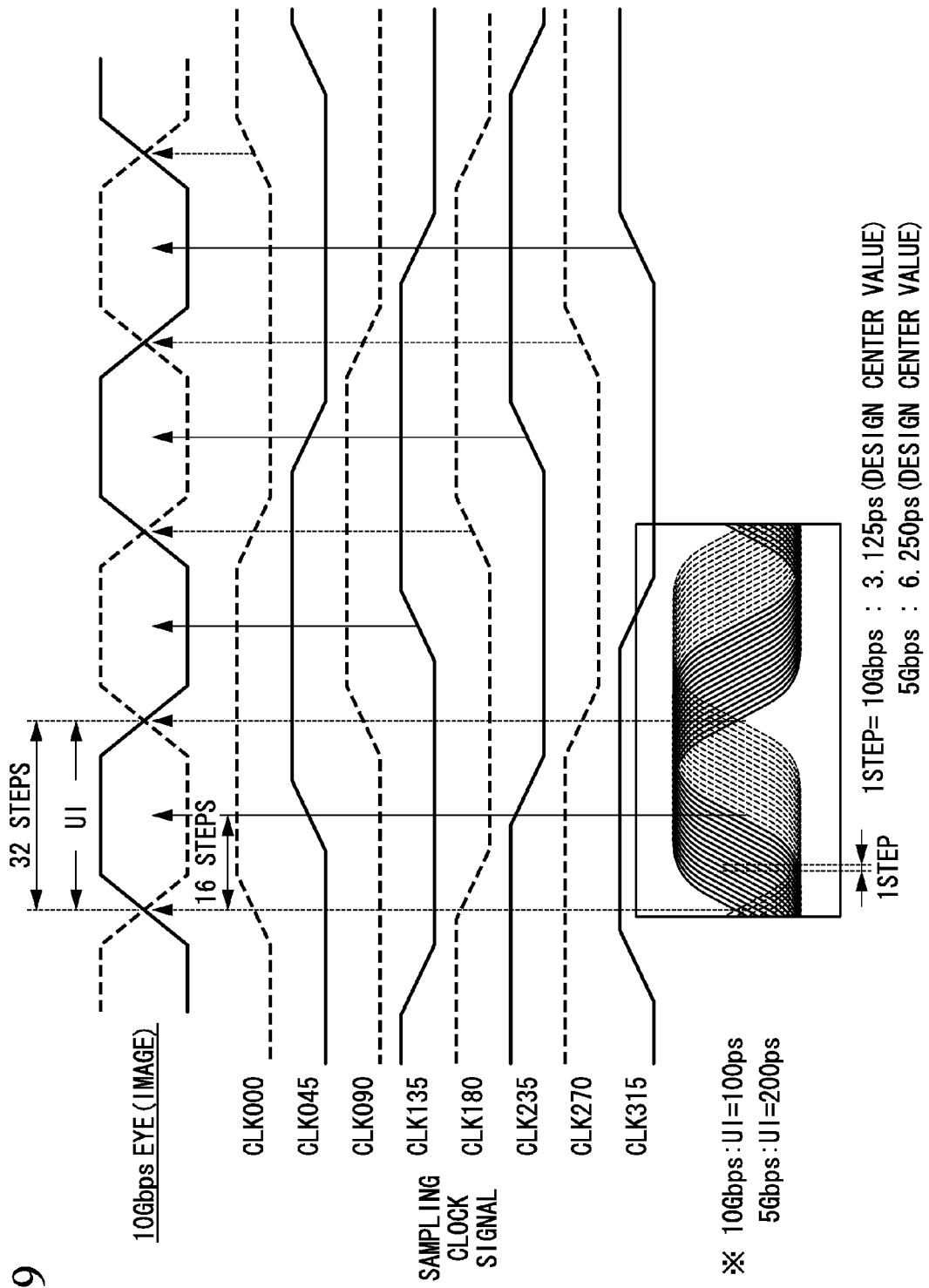
FIG. 9 shows variations of waveforms of output clock signals output from a phase selector included in the polyphase clock generator.

The phase selector 150 changes a combination of a delay for one step and a phase for sixteen steps in response to the signal SELP[15:0]. As shown in FIG. 9, it is possible to change over the delay phases of the output clock signals CLK000 to CLK315 at intervals of 2.8125° over the whole angular range of 360°. FIG. 9 show variations of waveforms of output clock signals output from the phase selector 150. Additionally, the CDR controller 13 sequentially changes combinations of signals SELC, SELP according to the binary code transition table of FIG. 8 in order to change the phases of the output clock signals CLK000 to CLK315 at intervals of 2.8125° over the whole angular range of 360°.

Figure 10:
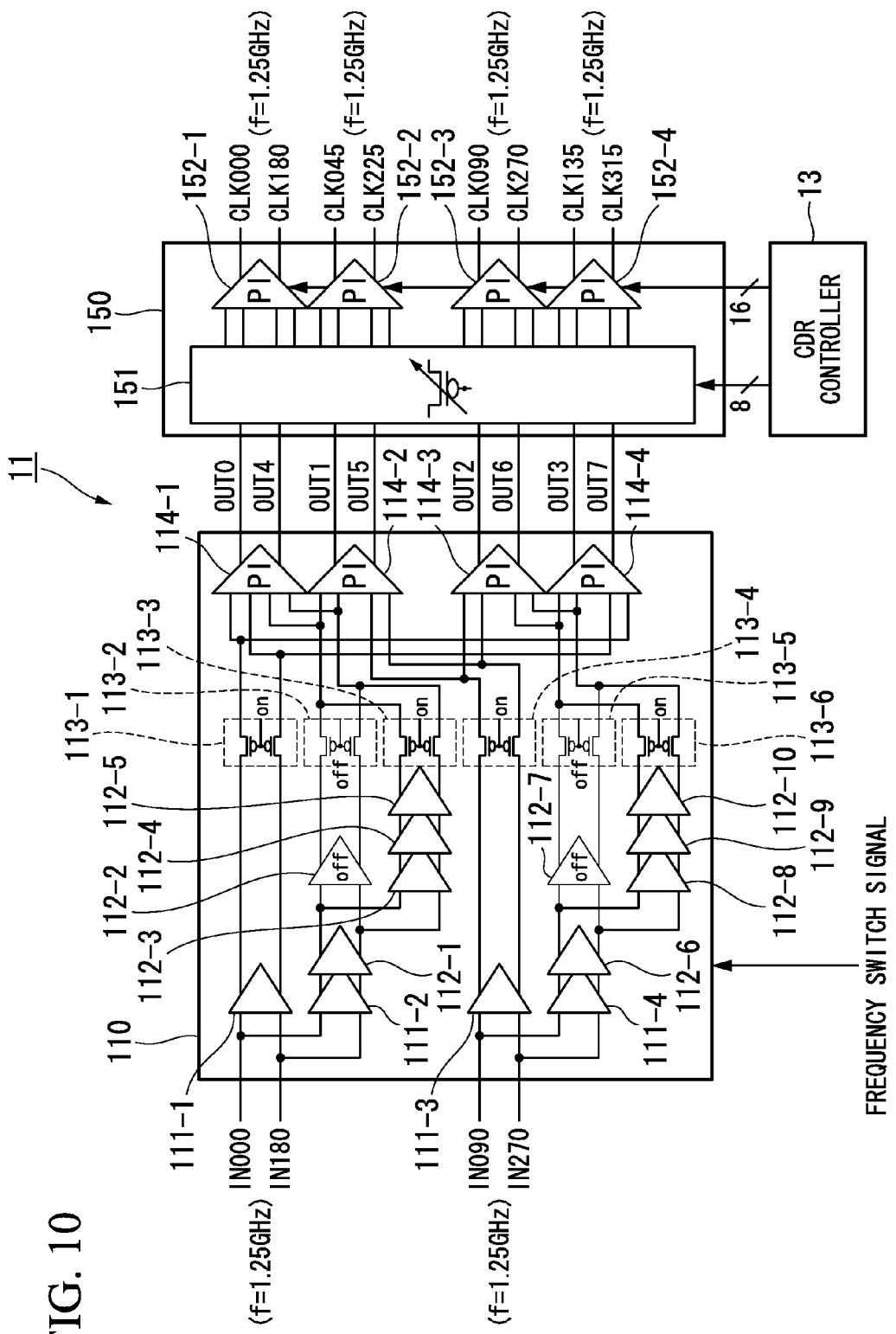
FIG. 10 is a block diagram showing an operating state of the polyphase clock generator at a clock frequency of 1.25 GHz.
Figure 11:
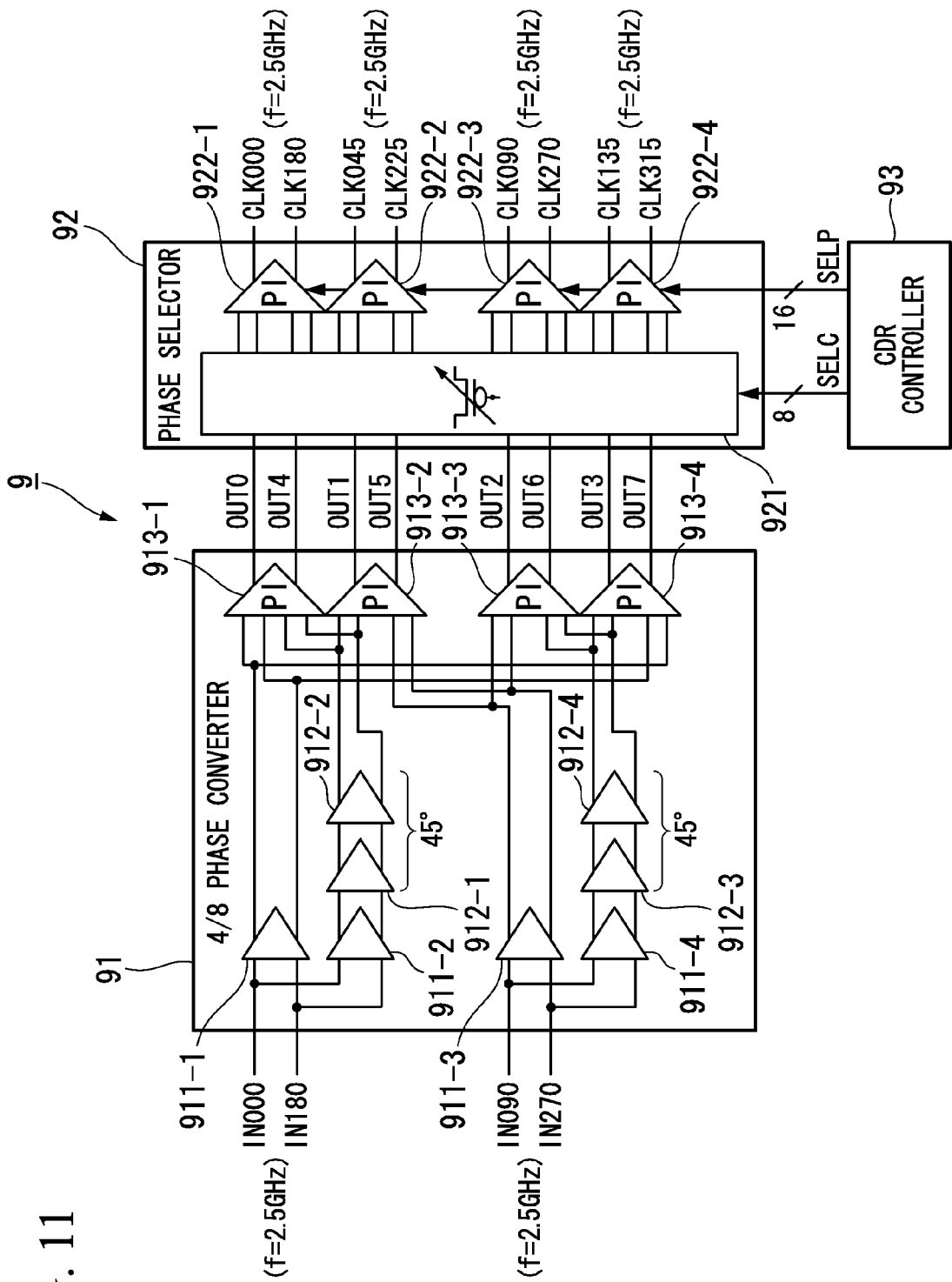
FIG. 11 is a block diagram showing an example of a polyphase clock generator applied to a CDR circuit.
Figure 12:
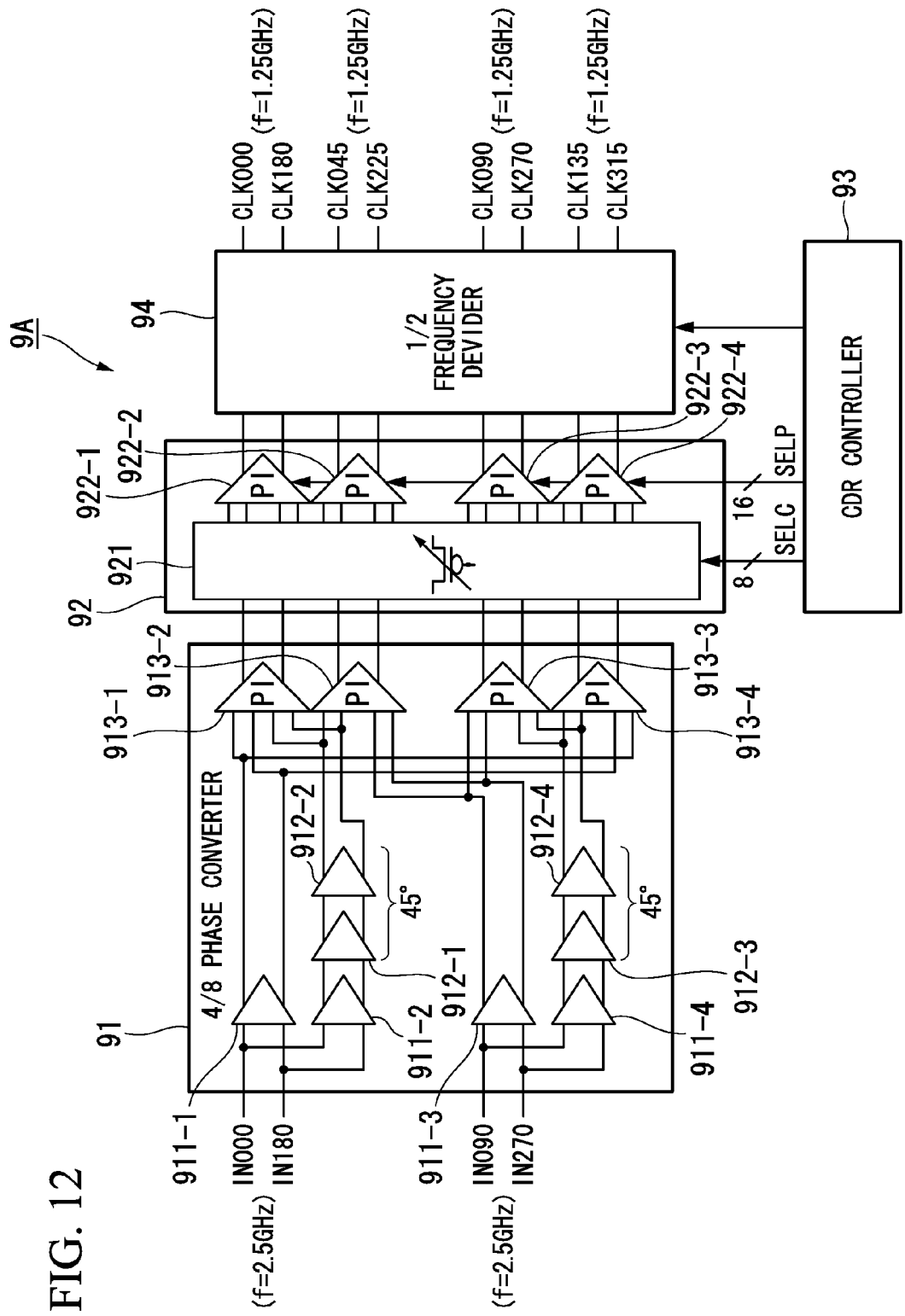
FIG. 12 is a block diagram showing another example of a polyphase clock generator including a frequency divider adapted to a lower frequency than its clock frequency.

FIG. 10 is a block diagram showing an operating state of the polyphase clock generator 11 at the clock frequency of 1.25 GHz. The polyphase clock generator 11 receives one reference clock signal IN000, indicating the reference phase, and three reference clock signals IN090, IN180, IN270 with phase differences of 90°, 180°, 270° relative to the reference phase. At the clock frequency of 1.25 GHz, the polyphase clock generator 11 turns on the switches 113-1, 113-3, 113-4, 113-6 while turning off the switches 113-2, 113-5 in response to the frequency switch signal.

In response to the frequency switch signal selectively turning on or off the switches 113-1 to 113-6, the number of buffers is changed from three to five on a delay path between the buffer 111-2 and the phase interpolators 114-1, 114-2 with respect to the reference clock signals IN000, IN180. Thus, the reference clock signals IN000, IN180 are delayed by a phase delay of 100 [ps], corresponding to the phase of 45° at 1.25 GHz, and supplied to the phase interpolators 114-1, 114-2. Similarly, the reference clock signals IN090, IN270 are delayed by a phase delay of 100 [ps], corresponding to the phase of 45° at 1.25 GHz, and supplied to the phase interpolators 114-3, 114-4.

The 4/8 phase converter 110 changes over a delay path (embedded therein) in connection with the reference clock signal input thereto. Thus, it is possible to generate clock signals with phase differences of 45°, 90°, 135°, 180°, 225°, 270°, 315° relative to the reference phase indicated by the reference clock signal IN000 at a clock frequency of 1.25 GHz.

In short, the polyphase clock generator 11 provides delay paths (i.e. a delay path connecting between the buffer 111-2 and the delay buffers 112-1, 112-2, and a delay path connecting between the buffer 111-4 and the delay buffers 112-6, 112-7) optimized to the clock frequency of 2.5 GHz used for the transmission rate of 10 Gbps. Additionally, the polyphase clock generator 11 provides delay paths (i.e. a delay path connecting between the buffer 111-2, the delay buffers 112-1 and 112-3 to 112-5, and a delay path connecting between the buffer 111-4, the delay buffers 112-6 and 112-8 to 112-10) optimized at the clock frequency of 1.25 GHz used for the transmission rate of 5 Gbps.

In response to the frequency switch signal from an external device (not shown), the polyphase clock generator 11 selects one of delay paths optimized to the clock frequency of the reference clock signal input thereto. Thus, it is possible to achieve the optimum operation of the polyphase clock generator 11, adapted to a plurality of clock frequencies (specified by a plurality of reference clock signals), without using a frequency diver or a frequency multiplier following the phase selector 150. Additionally, the polyphase clock generator 11 is able to apply clock signals, having phase differences determined in the design stage, to the phase interpolators 114, 152. Thus, it is possible to achieve the optimum operation of the polyphase clock generator 11, adapted to a plurality of clock frequencies, without causing unwanted stepwise differences in the output waveforms of the phase interpolators 114, 152.

The polyphase clock generator 11 includes the specially-designed 4/8 phase converter 110 whose circuit scale may be slightly increased due to the installation of a plurality of delay paths; however, the polyphase clock generator 11 shuts off power of producing output signals which are not involved in the main operation thereof by use of the switches 113-1 to 113-6, thus achieving a nearly-zero increase of power consumption.

As described above, the polyphase clock generator 11 satisfies requirements, such as high-speed processing of a CDR circuit using phase interpolators, adaptation to a wide range of clock frequencies, low power consumption, and a reduced area of circuitry on a chip.

The polyphase clock generator 11 allows the CDR circuit 1 to be adapted to a plurality of sampling clock signals (or output clock signals), thus improving an accuracy (or speed) of a high-speed interface circuit such as SERDES (i.e. a serialize-deserializer).

The present embodiment is designed to convert four reference clock signals into eight clock signals; but this is not a restriction. It is possible to employ a 2:4 phase-converting configuration for converting two reference clock signals into four clock signals, a 2:8 phase-converting configuration, a 4:4 phase-converting configuration, or a 4:16 phase-converting configuration. The present embodiment refers to the 4/8 phase converter 110 including a plurality of delay paths optimized to two clock frequencies; but this is not a restriction. It is possible to redesign the present embodiment to include a plurality of delay paths optimized to three or more clock frequencies.

Lastly, the present invention is not necessarily limited to the foregoing embodiment, which can be further modified in various ways within the scope of the invention as defined in the appended claims.

What is claimed is:

1. A polyphase clock generator operating based on a plurality of reference clock signals with different phases at a clock frequency, said polyphase clock generator comprising:
   a plurality of delay paths through which the plurality of reference clock signals is selectively delayed with different delay times;
   a plurality of switches that switch over the plurality of delay paths so as to select a group of delay paths suited to the clock frequency from among the plurality of delay paths; and
   a plurality of phase interpolators that interpolate the delayed reference clock signals, passing through the selected group of delay paths, into the reference clock signals, thus generating a plurality of clock signals with a predetermined phase difference therebetween.

2. The polyphase clock generator according to claim 1, wherein the plurality of delay paths is subdivided into a plurality of groups of delay paths in response to a plurality of clock frequencies, and wherein a group of delay paths is selected in response to the clock frequencies selected from among the plurality of clock frequency.

3. The polyphase clock generator according to claim 1, further comprising a phase selector which selectively combines the plurality of clock signals with a mixing ratio which is determined according to a clock data recovery process, thus generating a plurality of recovery clock signals.

4. The polyphase clock generator according to claim 1, wherein the number of the reference clock signals having a first phase difference therebetween is smaller than the number of the clock signals having a second phase difference therebetween so that the first phase difference is larger than the second phase difference.

5. A polyphase clock generating method comprising:
   receiving a plurality of reference clock signals with different phases at a clock frequency;
   selectively delaying the plurality of reference clock signals with a plurality of delay paths having different delay times;
   switching over the plurality of delay paths so as to select a group of delay paths suited to the clock frequency from among the plurality of delay paths; and
   interpolating the delayed reference clock signals, passing through the selected group of delay paths, into the reference clock signals, thus generating a plurality of clock signals with a predetermined phase difference therebetween.

6. The polyphase clock generating method to claim 5, further comprising:
   subdividing the plurality of delay paths into a plurality of groups of delay paths in response to a plurality of clock frequencies; and
   selecting a group of delay paths in response to the clock frequency selected from among the plurality of clock frequencies.

7. The polyphase clock generating method according to claim 5, further comprising:
   selectively combining the plurality of clock signals with a mixing ratio according to clock data recovery, thus generating a plurality of recovery clock signals.

* * * * *

UNITED STATES PATENT AND TRADEMARK OFFICE
CERTIFICATE OF CORRECTION

PATENT NO.        : 8,803,583 B2
APPLICATION NO.   : 13/592831
DATED             : August 12, 2014
INVENTOR(S)       : Takaaki Nedachi It is certified that error appears in the above-identified patent and that said Letters Patent is hereby corrected as shown below:

In the Drawings:

Drawing Sheet 11 of 13: Below "Sheet 11 of 13" insert -- Prior Art --

Drawing Sheet 12 of 13: Below "Sheet 12 of 13" insert -- Prior Art --

Drawing Sheet 13 of 13: Below "Sheet 13 of 13" insert -- Prior Art --

Signed and Sealed this
Twenty-fourth Day of February, 2015

Michelle K. Lee
*Deputy Director of the United States Patent and Trademark Office*